United States Patent [19]
Haghiri et al.

[11] Patent Number: 5,888,624
[45] Date of Patent: Mar. 30, 1999

[54] DATA CARRIER WITH AN ELECTRONIC MODULE AND A METHOD FOR PRODUCING THE SAME

[75] Inventors: Yahya Haghiri; Albert Ojster, both of München; Renée-Lucia Barak, Unterhaching, all of Germany

[73] Assignee: Giesecke & Devrient GmbH, Munich, Germany

[21] Appl. No.: 682,781

[22] PCT Filed: Feb. 3, 1995

[86] PCT No.: PCT/EP95/00397

§ 371 Date: Nov. 25, 1996

§ 102(e) Date: Nov. 25, 1996

[87] PCT Pub. No.: WO95/21423

PCT Pub. Date: Aug. 10, 1995

[30] Foreign Application Priority Data

Feb. 4, 1994 [DE] Germany ............ 44 03 513.6

[51] Int. Cl.⁶ .................................................. B32B 3/00
[52] U.S. Cl. ................... 428/195; 428/209; 428/211; 428/537.5; 428/901; 235/488; 235/492
[58] Field of Search .................... 428/195, 209, 428/211, 532, 537.5, 901; 235/487, 488, 492

[56] References Cited

U.S. PATENT DOCUMENTS

| | | | |
|---|---|---|---|
| 4,617,216 | 10/1986 | Haghiri-Tehrani et al. | 428/67 |
| 4,766,480 | 8/1988 | Hamada | 357/74 |
| 4,780,603 | 10/1988 | Hamada | 235/492 |
| 4,794,243 | 12/1988 | Hamada | 235/492 |
| 4,879,153 | 11/1989 | Ohashi et al. | 428/76 |
| 5,581,065 | 12/1996 | Nishikawa et al. | 235/492 |

FOREIGN PATENT DOCUMENTS

| | | |
|---|---|---|
| 0140230B | 5/1985 | European Pat. Off. . |
| 021506A | 3/1987 | European Pat. Off. . |
| 0277854B | 8/1988 | European Pat. Off. . |
| 0328124A | 8/1989 | European Pat. Off. . |
| 0412893B | 2/1991 | European Pat. Off. . |
| 0493738A | 7/1992 | European Pat. Off. . |
| 3239597A | 4/1984 | Germany . |
| 4142392A | 7/1993 | Germany . |

*Primary Examiner*—Elizabeth Evans
*Attorney, Agent, or Firm*—Stevens, Davis, Miller &Mosher, L.L.P.

[57] ABSTRACT

The invention relates to a data carrier comprising a one- or multilayer card body in which an electronic module is embedded. The layers of the card body consist of paper and/or cardboard and are interconnected for example by thermally activable adhesive or contact adhesive. The cards can be produced by continuous technology, the individual card layers being supplied from endless rolls, provided with the necessary windows for receiving the modules, and finally interconnected. The modules are inserted in the resulting gaps. The individual cards are punched out.

30 Claims, 8 Drawing Sheets

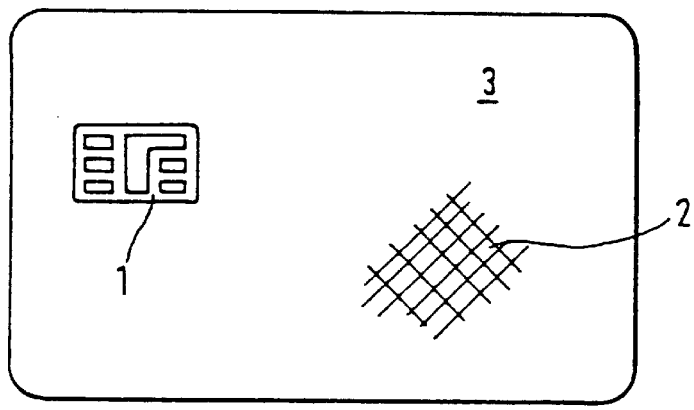
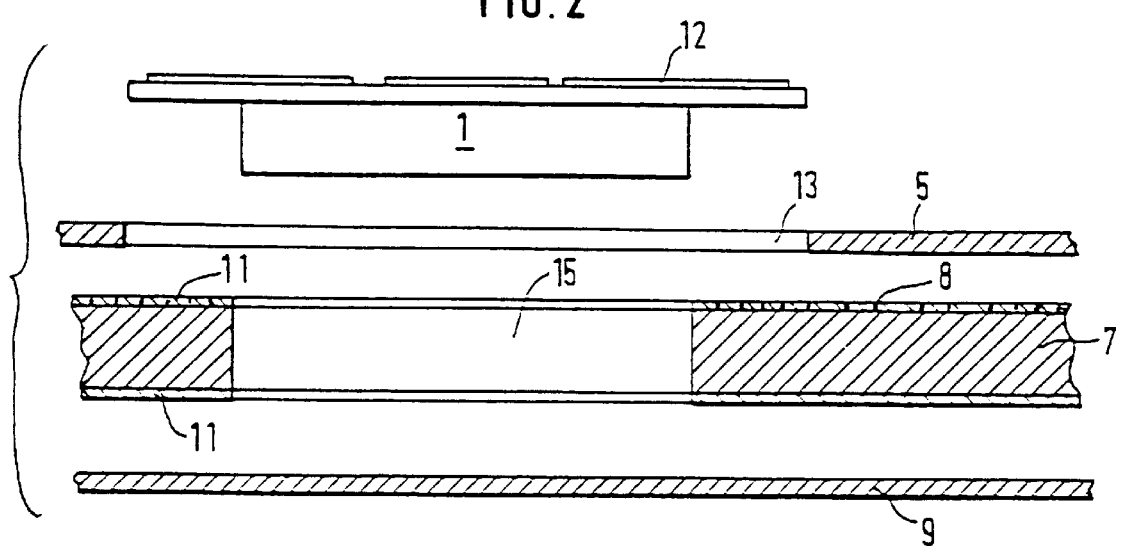

DATA CARRIER WITH AN ELECTRONIC MODULE AND A METHOD FOR PRODUCING THE SAME

This invention relates to a one- or multilayer data carrier with an embedded electronic module, in particular a chip card. Furthermore the invention relates to a production method for such data carriers.

In the past various IC cards have become known which are produced by various methods.

For example EP-B1 0 140 230 discloses an IC card constructed from a plurality of plastic layers and produced by the so-called laminating technique. For this purpose one provides a structure consisting of an upper cover layer, at least one core layer and a lower cover layer. Between the upper cover layer and the core layer one places an electronic module consisting of a substrate on which an integrated circuit with contact surfaces is disposed. This structure is interconnected under the action of heat and pressure, the contact surfaces of the module coming to lie in gaps in the upper cover layer, and the integrated circuit in a gap in the core foil. The compound of plastic layers arises from the layers softening and interconnecting during lamination. In the finished card the module is embedded between the upper cover layer and the core layer.

EP-A1 0 493 738 further discloses an IC card produced by the so-called mounting approach. This technique is characterized in that a card body with a multistep gap is first provided. The electronic module is then introduced into the gap and glued. This is done with a thermally activable adhesive in EP-A1 0 493 738.

The provided card body can first be produced without a gap e.g. by laminating a plurality of plastic layers. In a further step the gap is then produced e.g. by milling.

However the card body can also be produced differently. For example DE-A1 41 42 392 discloses manufacturing the card body by injection molding. One uses an injection mold whose cavity corresponds to the form of a card body. After the cavity has been almost completely filled the gap is produced in the card body during the injection molding process with a movable die which can be moved into the cavity. After completion of the card body the electronic module is glued in by a second step.

Alternatively it is possible to use the movable die directly for pressing the module into the as yet unhardened plastic material of the plastic body. In this case the production of the card body and the embedding of the module are completed in one operation.

IC cards produced by injection molding are also known from EP-B1 0 277 854. Here it is proposed that the electronic module be already inserted in the mold while the plastic material is being injected. The module is fixed in the mold by suction air applied from outside. The module casting for protecting the integrated circuit is formed on a slant and thus held reliably in the card body by the surrounding injection molding material.

In addition to the method steps for producing the card body and embedding the module according to DE-A1 41 42 392 or EP-B1 0 277 854, further measures are to be provided for applying printed images on the card surface. However, EP-B1 0 412 893 discloses an injection molding method for producing IC cards wherein the IC card can be already provided with a graphic element during injection molding. For this purpose a card-sized paper layer printed on both sides is inserted in the mold. After that a transparent plastic material is injected in the mold so that the printed image can be seen from both sides of the card in the finished card body.

In this method a gap for the electronic module can either be produced by a die protruding into the mold, or the module can be fixed directly and molded around in the mold.

In the stated methods the one- or multilayer card body consists of plastic material. With the laminating technique the card layers are interconnected under the action of heat and pressure and finally cooled. This takes a relatively long time. Although such cards are produced "in packages" in a stack of so-called multiple-copy sheets, and although the electronic module can already be laminated in during welding of the plastic layers, the throughput of finished cards per unit of time is greatly limited. This limitation is naturally also reflected in the card price.

With the injection molding technique the production of the card body or the IC card is relatively easy and less time-consuming to perform. However the plants for producing injection-molded parts or injection-molded cards have a high purchasing price. Furthermore these plants are designed predominantly for single card production so that the throughput per unit of time is in the same range as with laminated cards.

It follows from the above that a further cost reduction in the unit price of an IC card is possible only to a small extent, if at all, with the techniques used up to now for producing the IC card.

It is therefore the problem of the invention to propose an IC card wherein the card structure and the method for producing the card permit a further cost reduction.

This problem is solved by the characterizing features of the main claim.

The advantages of the invention are to be seen in particular in that the paper layers required for the card structure can be supplied from a roll, regardless of whether the card is a one-layer or multilayer card, and the paper IC card can thus be manufactured by continuous technology. It is very easy to glue together a plurality of layers, since the layers glued either cold or using thin thermally activable adhesives can be produced without long waiting times. Furthermore all techniques known from conventional paper processing can be transferred to the production of the paper IC card, in terms of both the connection of the individual card layers and the printing of the card layers. For example the printing techniques known from paper technology can be used cost-effectively, e.g. by web or sheet printing of the layers. One can achieve all printing qualities known from paper technology. Furthermore, the paper IC card is environment-friendly and recyclable, unlike the plastic card. A further advantage of the IC card is that it has high thermostability, depending on the adhesive used. Also, due to its absorbent surface the paper IC card can be provided with individual data in a simple manner, for example using an ink jet printer. Finally, the paper IC card can be provided with all security features which have become known from paper-of-value production. For example it is possible to provide one of the paper layers with a security thread known from bank-note production and to integrate it in the card.

As the prior art shows, the entire, almost twenty-year development of the IC card has been oriented toward plastic as the card body material. This is readily understandable since plastic is a material which is both durable and has high resistance.

In the course of development of the IC card, however, applications have also become known in which the cards are used for shorter terms. An example of such an application is the telephone card. Plastic has been simply adopted as the material for telephone cards as well. There is thus evidently a prejudice among experts against considering materials other than plastic for the production of cards with integrated circuits, because it is thought that only this material can yield cards offering the necessary protection for the sensitive IC module. Despite the abovementioned considerable advantages which a paper or cardboard card offers, this material has in any case been disregarded up to now for the production of cards with integrated circuits.

In a preferred embodiment of the invention a paper card body is first produced in which the electronic module is later glued. The card body can consist of a plurality of paper layers or of one cardboard layer.

In a further embodiment of the invention the electronic module is laminated into the card body during production of the cards. The module can either be embedded between two layers or glued into a gap. e.g. with a liquid adhesive In a further preferred embodiment an electronic module suitable for noncontacting data exchange is introduced into a gap in the core layer during lamination of a plurality of card layers.

Some embodiments and further advantages of the invention will be explained more closely in connection with the following figures, in which:

FIG. 1 shows an IC card in a plan view

FIG. 2 shows a cross section through a card body layer structure

Figure 4:
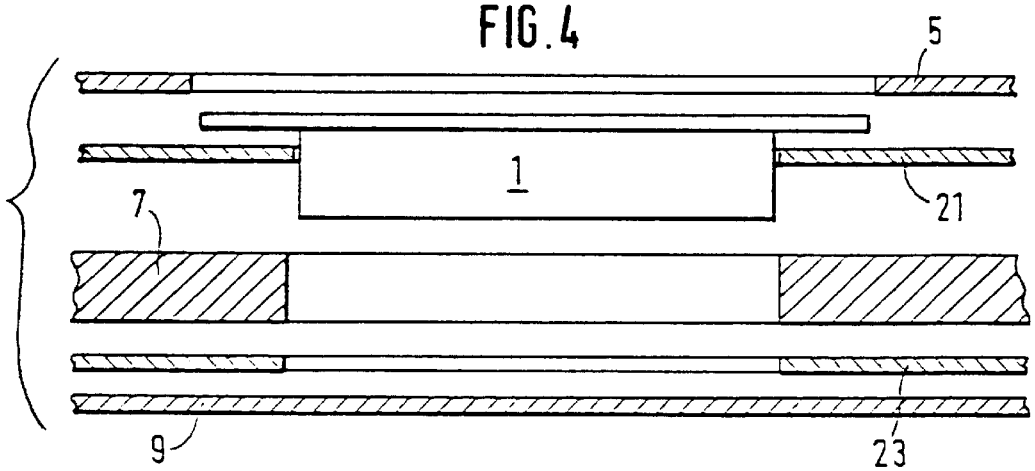
Figure 12:
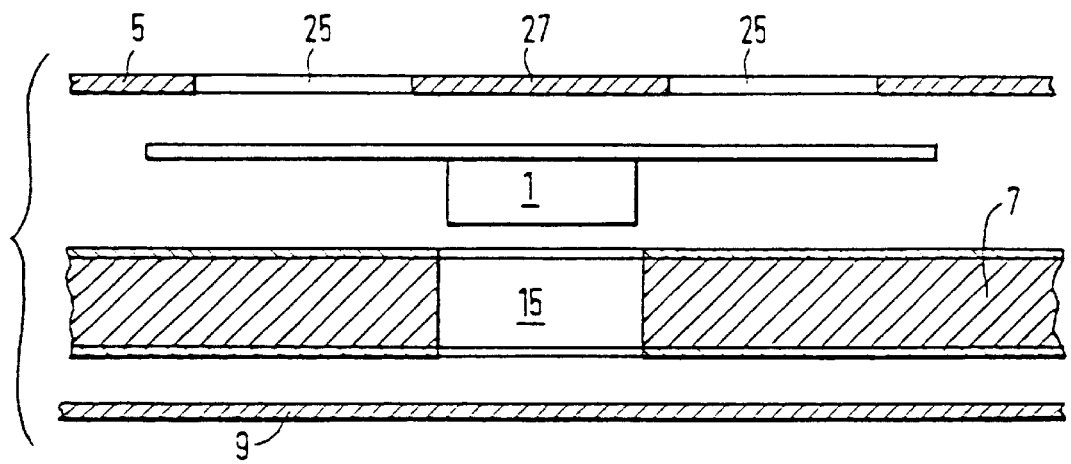
Figure 5:
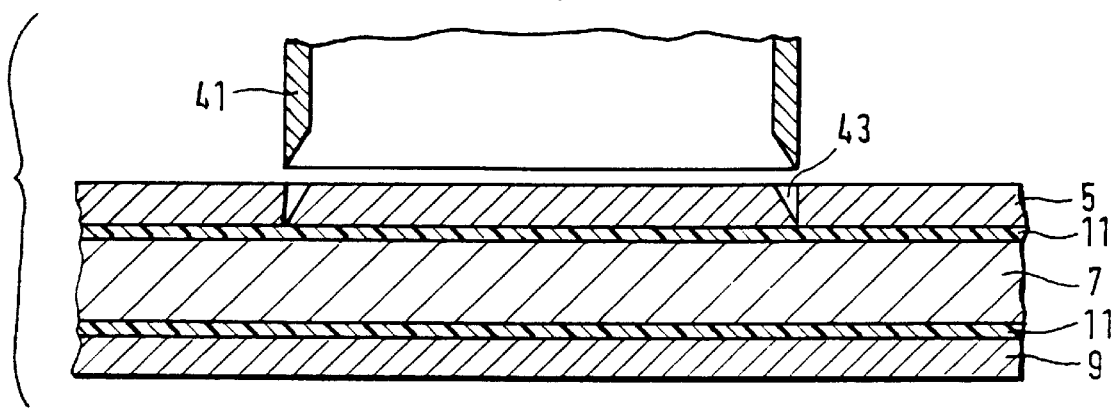
Figure 6:
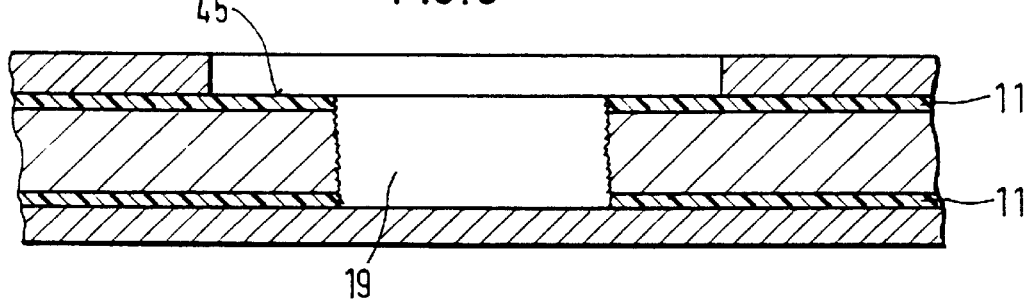
Figure 7:
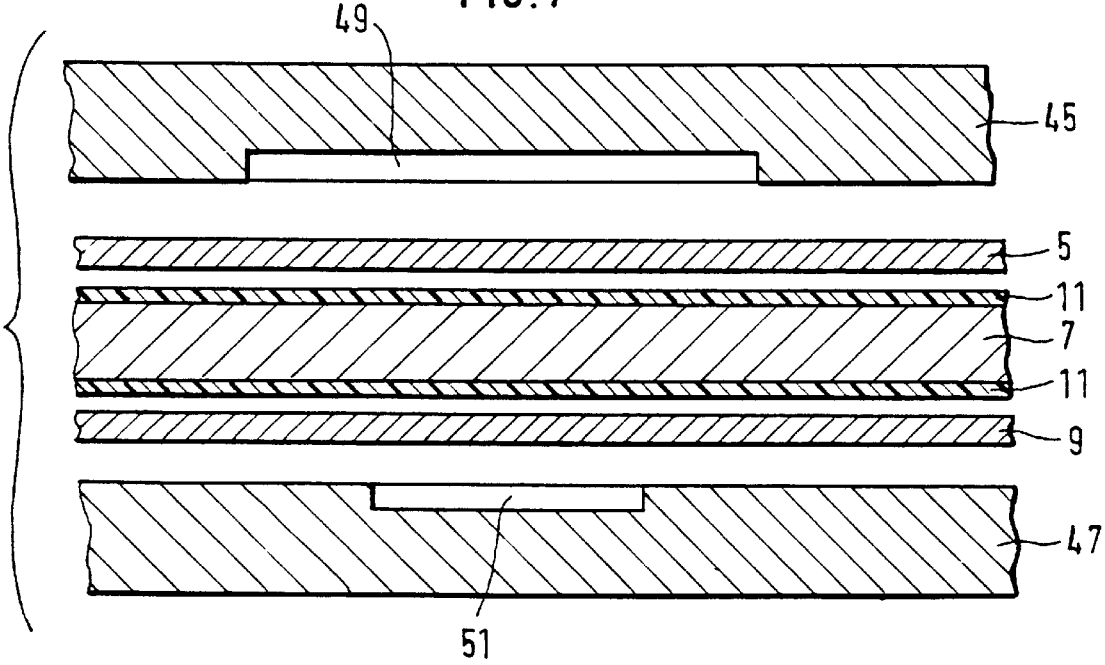
Figure 8:
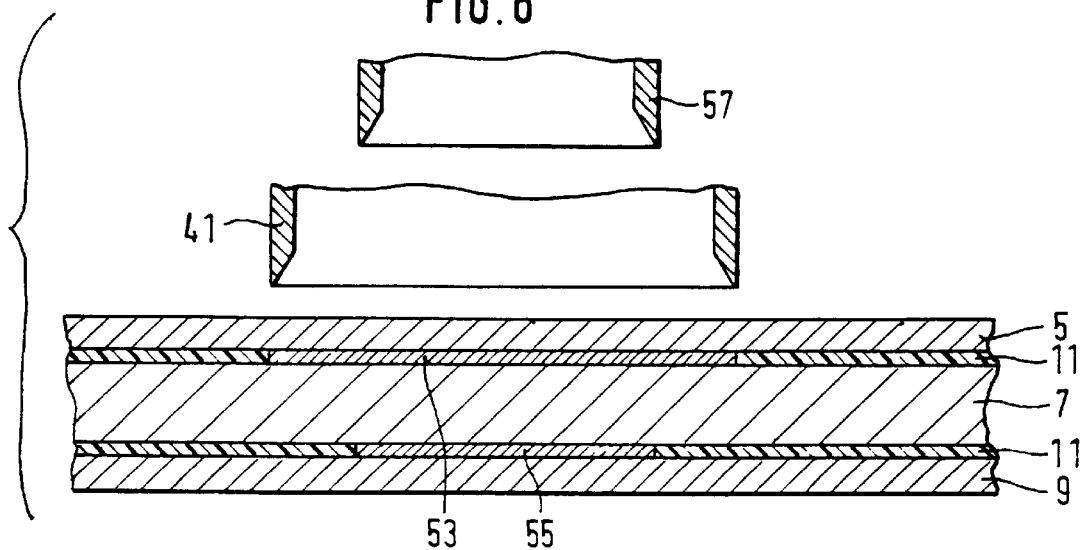
Figure 9:
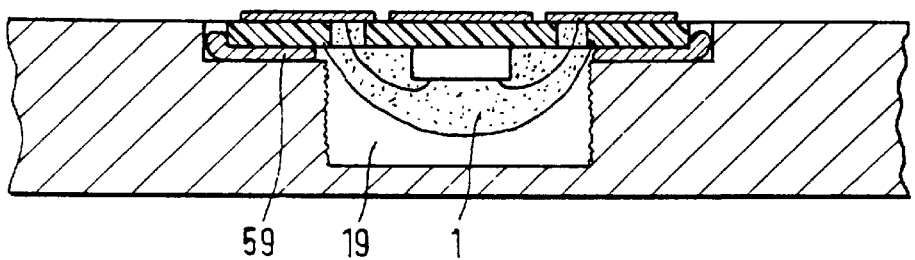
Figure 10:
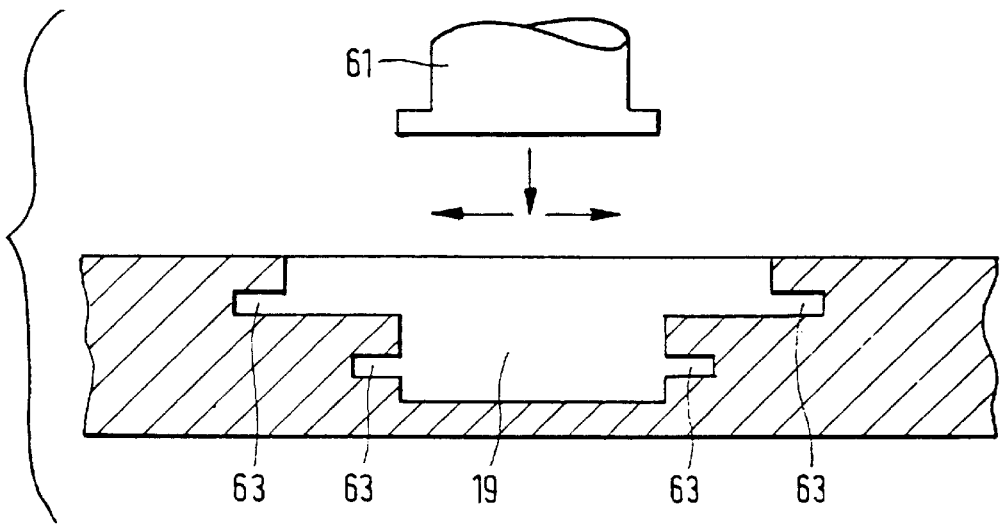
Figure 11:
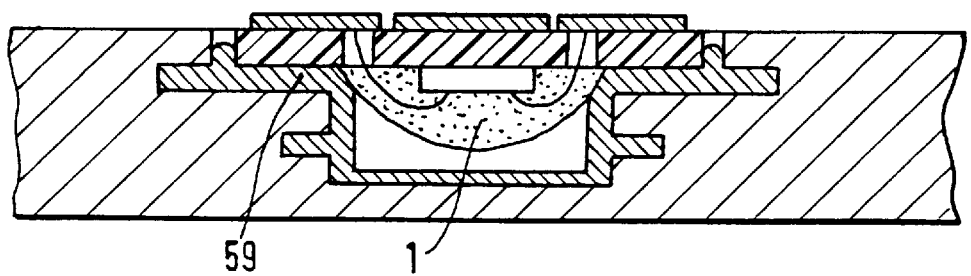
Figure 18:
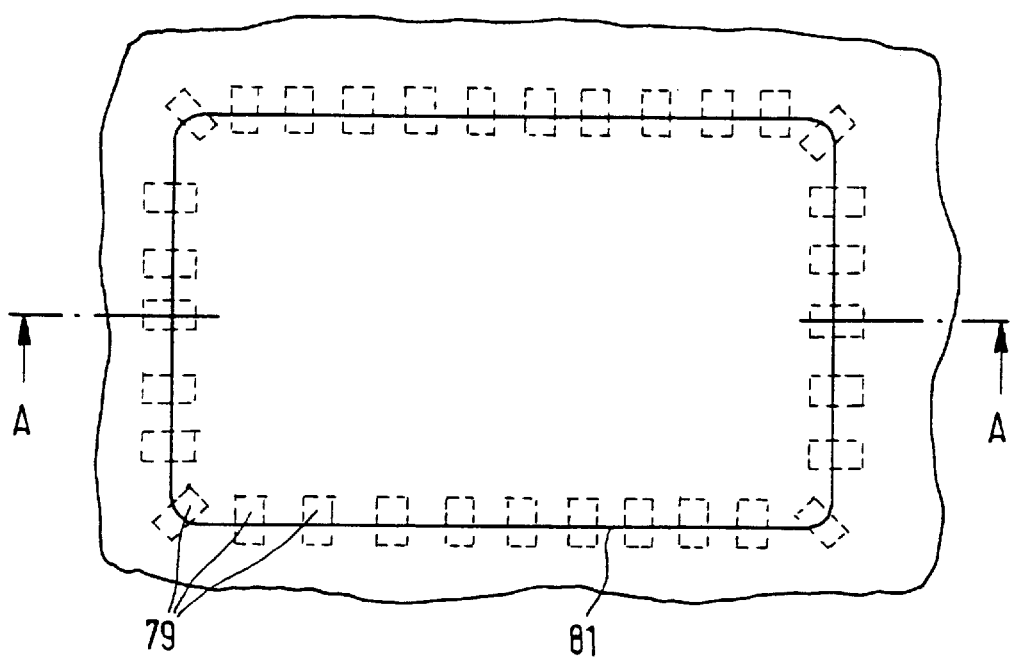
Figure 19:
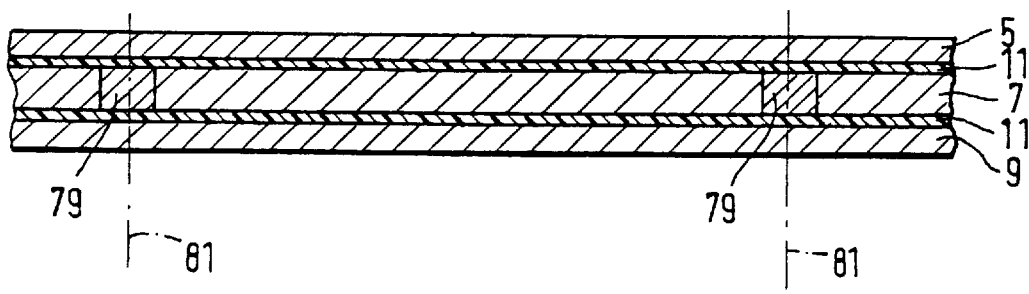
Figure 13:
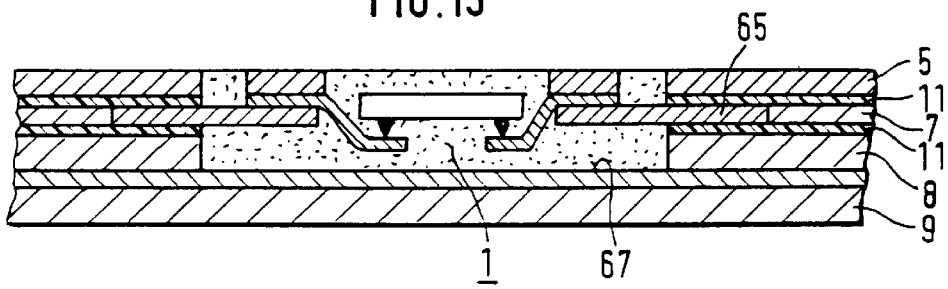
Figure 14:
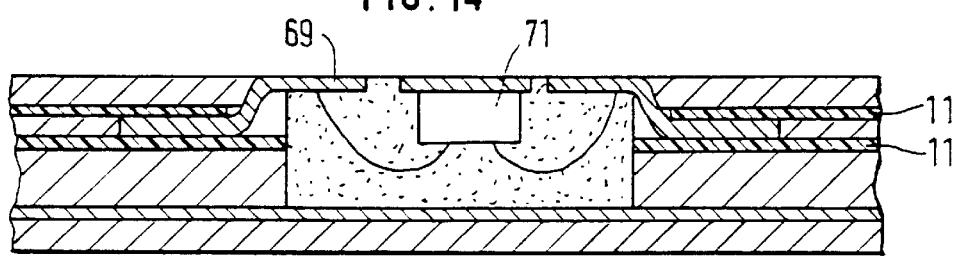
Figure 15:
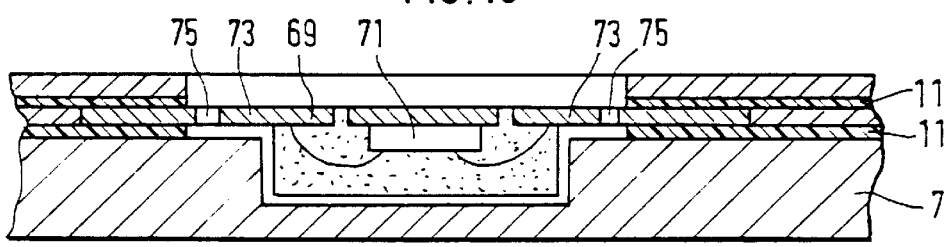
Figure 16:
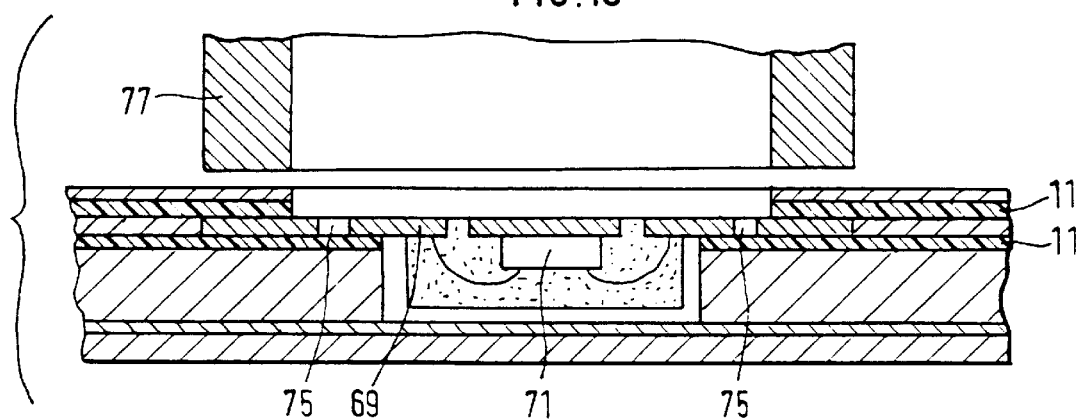
Figure 17A:
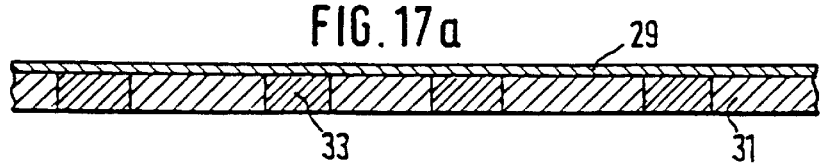
Figure 17B:
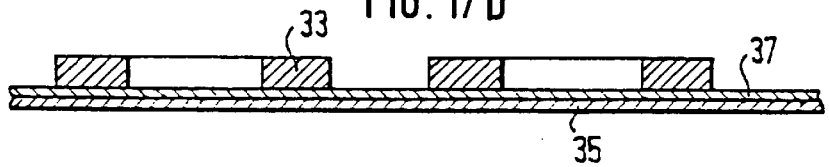
Figure 17C:
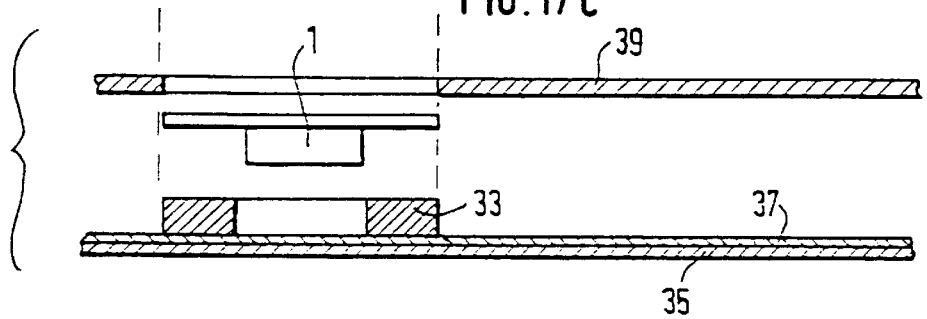
Figure 17D:
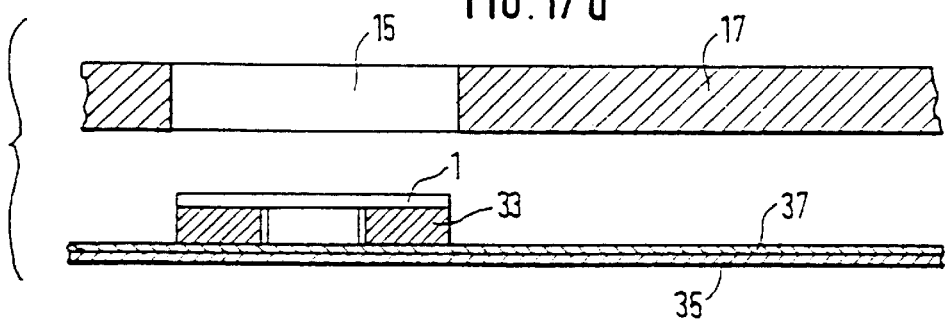
Figure 17E:
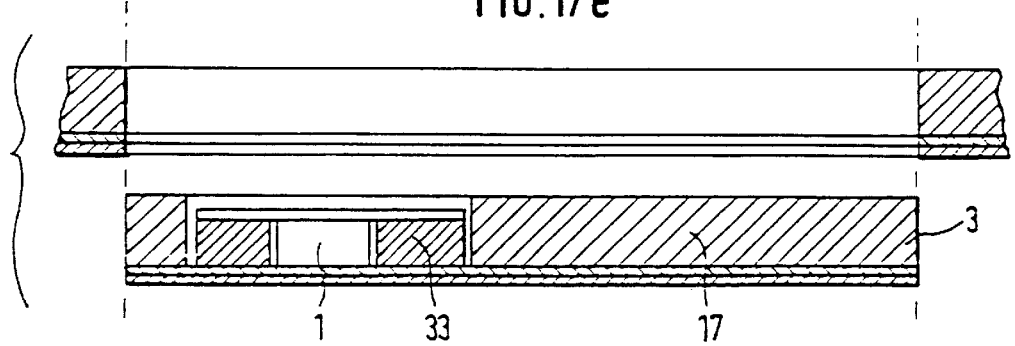

FIG. 4 shows a layer structure for a card to be produced by the laminating technique in cross section FIG. 5 shows a layer structure of a card in cross section FIG. 6 shows the layer structure from FIG. 5 in cross section but with a gap FIG. 7 shows a layer structure of a card before connection of the individual layers in cross section FIG. 8 shows the layer structure from FIG. 7 in cross section, the card layers being interconnected FIG. 9 shows an IC card in cross section FIG. 10 shows a card body with a gap in cross section FIG. 11 shows an IC card in cross section FIG. 12 shows a layer structure for a card to be produced by the laminating technique in cross section FIG. 13 shows an IC card in cross section FIG. 14 shows an IC card in cross section FIG. 15 shows an IC card in cross section FIG. 16 shows an IC card in cross section FIG. 17a–e show a method for producing an IC card FIG. 18 shows a multilayer endless band in a plan view FIG. 19 shows a cross section from FIG. 18

Figure 20:
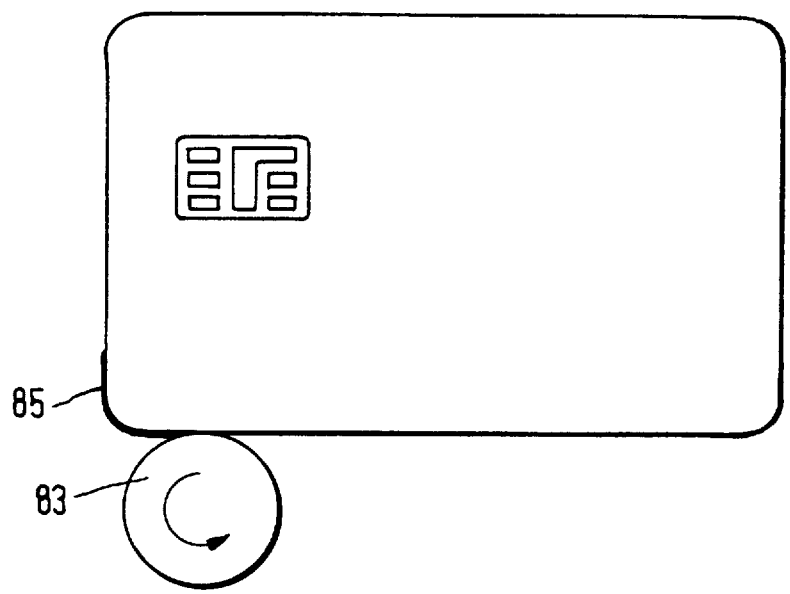

FIG. 20 shows an IC card in a plan view

Figure 21:
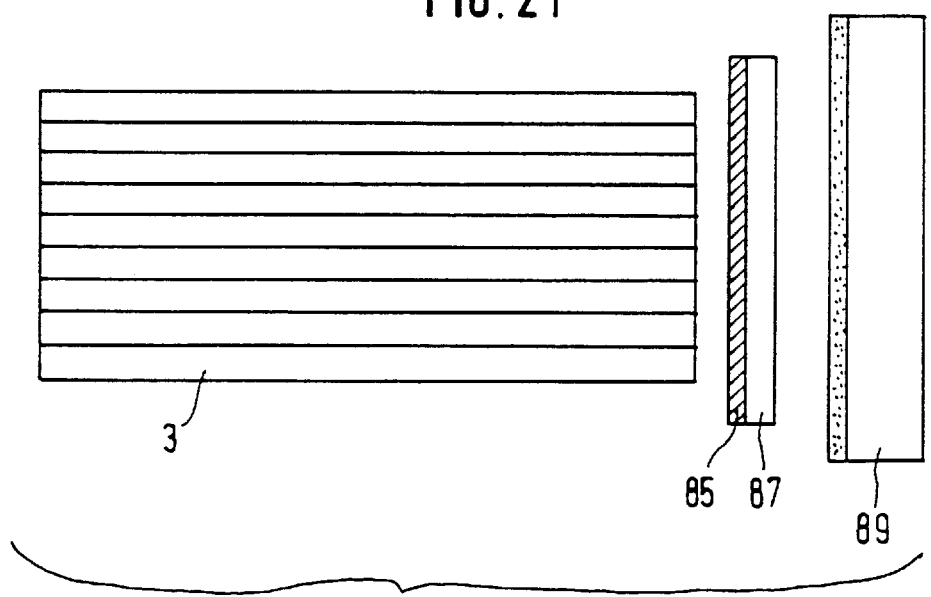

FIG. 21 shows a stack of IC cards in cross section.

FIG. 1 shows an IC card with electronic module 1 in card body 3 in a plan view. Card body 3 has dimensions which are fixed in an ISO standard designated ISO 7810. Electronic module 1 is embedded in the card body at a defined position likewise fixed by an ISO standard designated ISO 7816/2. According to the invention card body 3 of the IC card is produced from one or a plurality of paper and/or cardboard layers.

FIG. 2 shows a multilayer card structure in cross section prior to lamination of the individual card layers. The card structure consists of upper cover layer 5, core layer 7 and lower cover layer 9. Core layer 7 is provided on both sides with thin thermally activable adhesive layer 11 used for gluing together the layers. Before the individual layers are brought together, windows 13, 15 are punched in layers 5 and 7 so that a two-step gap arises in the card body after the three layers are brought together and glued. If a plurality of core layers are used it is also possible to produce a multistep gap in the card body, whereby the windows become increasingly small in the individual core layers, considered from the upper cover layer. Such a card structure is especially advantageous when the casting compound of the electronic module has a drop shape, as shown e.g. in FIG. 9, since the contours of the gap can then be readily adapted to the shape of the casting compound and the bottom area of the gap is small.

The card laminate can be produced in high throughputs. Layers 5, 7 and 9 can thus be supplied from rolls and guided for lamination through heated laminating rolls between which the thermally activable adhesive layers are activated. One thus obtains an endless laminate provided at suitable intervals with gaps for receiving the electronic modules. The individual card bodies are punched out of this endless laminate in a further method step. Electronic modules 1 are glued into the card body gaps. The necessary adhesive can either be located directly on the module or be introduced into the gap e.g. in the form of liquid adhesive. The module can be incorporated in the card body before or after the card is punched out.

To increase the bond strength between the module and the card body one can, instead of using thermally activable adhesive 11 located above the card layer, provide core layer 7 with cloth 8 impregnated with a thermally activable adhesive. FIG. 2 indicates the cloth by the dots in upper thermally activable layer 11. The cloth can be selected so as to allow optimum bond strength between the electronic module and the card body. In the finished card the cloth is thus located between cover layer 5 and core layer 7. The firm connection of the module with the cloth thus anchors the module between the card layers in the finished IC card. As an alternative to a cloth located all over core layer 7, one can also provide a cloth or foil only in the area of window 15 in core layer 7. This will also achieve the abovementioned effects.

The module shown in FIG. 2 bears on surface 12 contact surfaces for contacting communication. Alternatively the IC card can also be provided with an electronic module suitable for noncontacting data exchange. Such a module can be inserted in window 15. In this case one can thus dispense with window 13 in cover layer 5, so that in the finished IC card the module for noncontacting data exchange is located in window 15 between cover layers 5 and 9.

Figure 3:
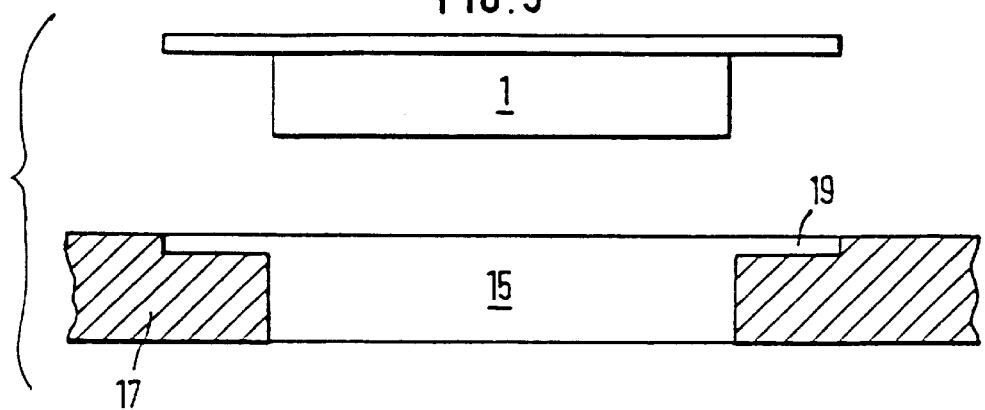
FIG. 3 shows a cross section through a card body with a gap

FIG. 3 shows the card body of a single-layer cardboard card in cross section. Cardboard 17 can likewise be supplied from a roll. Windows 15 are punched in the cardboard at suitable intervals. Further, by debossing cardboard 17 in the area of window 15 one produces shallow gap 19 which has a greater diameter than window 15. Electronic module 1 can be glued into the resulting gap in the cardboard, the bottom of gap 19 being used as an adhesive layer. The module can again be glued into the gap using an adhesive located on the module, which can be a thermally activable adhesive or a contact adhesive, or using a liquid adhesive. The card can be punched out of the endless cardboard before or after gluing. In the finished IC card a part of window 15 which is not filled by the module can be located in the module area on the back of the card. To give the card a better appearance one can additionally close this part, e.g. by casting with a casting compound or by other measures.

FIG. 4 again shows a multilayer card structure prior to lamination in cross section. Layers 5, 7 and 9 are identical with those from FIG. 2. In addition to these layers the structure has separate adhesive layers 21 and 23 which are also provided with suitable punchings.

Adhesive layers 21 and 23 can be formed either as thermally activable layers or as contact adhesive layers. In the latter case the windows must be produced in the layers when the layers are still coated with a silicone band in order to prevent the punching tools from sticking. After the punching of the windows the silicone bands can be rolled off the contact adhesive layers and onto other rolls.

Electronic module 1 can already be inserted in the windows of adhesive layer 21 prior to roll lamination in such a way that the contact surface area lies on adhesive layer 21 and the area of the module receiving the integrated circuit is located in the window, as shown in the figure. During lamination of the shown card layers the shown module is thus glued in the card body gap at the same time as adhesive layer 21.

If the electronic module is not to be glued in the gap during lamination of the card body it is also possible to punch out the window in adhesive layer 21 with exactly the size of the window in cover layer 5. In this case the shoulder of the two-step gap remains free from the adhesive layer during lamination of the layers so that no adhesive material can penetrate onto the surface of the card during heating of this layer. Such an embodiment is especially advantageous when the punched-out card body is to be stored as an intermediate product. The card structure shown in FIG. 4 is also especially suitable for embedding a module for non-contacting data exchange. In this case one can again dispense with the windows in layers 5 and 21.

FIGS. 2 and 4 show multilayer card structures in which the individual layers already have windows before joining which make up a gap in the card body after the layers are joined. In contrast, FIGS. 5 to 8 show embodiments in which the gap is provided in the card body subsequently.

FIG. 5 shows a card structure consisting of core layer 7 and cover layers 5 and 9, the layers being interconnected by thermally activable adhesive layers 11. The thermally activable adhesive layers used can be e.g. extremely thin polyethylene (PE) foils or amorphous polyethylene terephthalate (APET) foils, which are applied to core layer 7 on both sides. In cover layer 5 one first produces with cutting tool 41 edge 43 which fixes the edge of the first part of a two-step gap. One then uses a milling tool to produce two-step gap 19 shown in FIG. 6 in the card body in such a way as to expose thermally activable adhesive layer 11 on shoulder 45.

The use of a cutting tool for producing edge 43 has the advantage that a clean and optically flawless edge arises in the visible area of the finished chip card, whereas if one uses a milling tool for producing a gap in the paper one cannot avoid "fraying" on the edges, as indicated in FIG. 6 in the edge area of the bottom part of the two-step gap. It is of course also possible to dispense with the use of a cutting tool and produce the gap solely with a milling tool.

An electronic module, as shown for example in FIG. 2, is introduced into two-step gap 19 in the card body (see FIG. 6) and glued on shoulder 45 with the help of thermally activable adhesive layer 11 exposed during the milling process. It is of course also possible to provide the electronic module additionally with an adhesive to improve the bond with the card body. This is especially advantageous when thermally activable adhesive layers 11 are very thin and adhesive layer 11 in shoulder area 45 of the gap is damaged or removed intentionally or unintentionally during the milling process.

FIG. 7 shows the same layer structure as FIG. 5, but cover layers 5 and 9 are not yet connected with core layer 7. In the shown embodiment the card layers are interconnected under the action of heat and pressure with heated dies 45 and 47, heated dies 45 and 47 having gaps 49 and 51 in the area where the gap is subsequently produced in the card body. In the area of these gaps thermally activable layers 11 are thus not activated when the layers are connected so that no bond is produced between the card layers in this area.

FIG. 8 shows the card structure from FIG. 7, the individual card layers now being interconnected. Due to the special design of the heated dies cover layer 5 has not interconnected with core layer 7 in area 53, or cover layer 9 with core layer 7 in area 55. Using cutting tool 41 one can now produce the top part of a two-step gap by first introducing cutting tool 41 into the card body at least far enough for cover layer 5 to be severed. The part of the cover layer located within the edge of cut can then be easily removed since this part has not bonded with adhesive layer 11. The bottom part of two-step gap 19 can be produced analogously using cutting tool 57. One thus obtains a card body, as already shown in FIG. 6, with a two-step gap which now has clean edges of cut in the entire wall area. The described method is of course not restricted to the production of a two-step gap. One can also produce stepless or multistep gaps in the card body in analogous fashion.

The production method described in connection with FIGS. 7 and 8 is suited especially for card bodies consisting exclusively of paper and cardboard, since the individual paper layers are not softened during connection, as happens during lamination of plastic layers. With the help of the shown heated dies the heat is conducted only through the paper to the thermally activable adhesive layers, which are then activated. The paper layers themselves thus remain dimensionally stable throughout the production method, so that there is no distortion of the paper layers whatsoever even at the transitions to the unheated areas (see FIG. 7). The bottom area of the two-step gap is thus very plane in the finished card body.

FIG. 9 shows a single-layer card body with two-step gap 19 in which electronic module 1 is glued with liquid adhesive 59. In the daily use of chip cards there are bending loads which act on the card body including the area of the electronic module. Due to these bending loads and the splittability of paper, the paper in the embodiment shown in FIG. 9 can split in shoulder area 45 (see FIG. 6) in gap 19 directly below the liquid adhesive, so that the electronic module comes out of the card body in the course of time.

Although paper chip cards are preferably to be used for applications in which the card need have only a short service life, and a card structure as shown in FIG. 9 is thus basically durable enough, the compound between the electronic module and the card body can be improved by providing two-step gap 19 with undercuts 63 using suitable milling tool 61, as shown in FIG. 10.

A dosed quantity of liquid adhesive 59 is introduced in two-step gap 19, being distributed in gap 19 upon incorporation of electronic module 1 in such a way that undercuts 63 are also filled with liquid adhesive 59 (see FIGS. 10 and 11). Thus electronic module 1 is anchored in the card body and secured against forces acting perpendicular to the card surface. Furthermore the liquid adhesive now moistening the entire wall area of the gap also offers good protection against splitting of the paper in this area. Alternatively it is of course also possible to dispense with undercuts and dose the liquid adhesive so that it moistens the wall area largely or completely in the finished card.

FIG. 12 again shows a multilayer card body prior to lamination in cross section. Individual layers 5, 7 and 9 are identical with the layers shown in FIG. 2. However upper cover layer 5 has instead of window 13 two windows 25 separated by bar 27. Before lamination electronic module 1 is inserted in window 15 of core layer 7 in the way indicated in FIG. 12. During roll lamination of the layers module 1 is glued to layer 7 and embedded additionally between layers 5 and 7. In the finished IC card the contact surfaces of module 1 are located in windows 25 and the embedding between the layers brought about by bar 27. A module especially suitable for the abovementioned production technique is described exactly in EP-B1 0 140 230.

FIGS. 13 to 16 show further embodiments in which the electronic module is already anchored in the card body during production of the card by embedding parts of the module between two card layers.

FIG. 13 shows a multilayer card structure consisting of cover layers 5 and 9 and core layers 7 and 8. Electronic module 1 incorporated in the shown card structure has anchoring frame 65 which protrudes beyond casting 67 of the module and is already embedded between two card layers 5 and 7 during production of the cards. As shown in FIG. 13, anchoring frame 65 is surrounded on both sides by thermally activable adhesive layers so that a good bond arises between the anchoring frame and the card body. In a preferred embodiment the anchoring frame is formed as a cloth into which adhesive material from adjacent adhesive layers 11 can penetrate during card production. This results in an indirect compound of adjacent adhesive layers 11 and an improved anchoring of the module in the card body.

FIGS. 14 to 16 show further embodiments in which the electronic module is embedded between two card layers. The modules in these figures all have the same structure and are referred to in general as lead frame modules. They consist of metal wafer 69 in which a contact layout is formed and which has applied to one side IC module 71 which is electrically connected with the contact surfaces of the contact layout. The IC module and electric connections are surrounded by a casting compound for protection from mechanical loads. In the shown embodiments the anchoring frame is formed by extensions of the contact surfaces which protrude beyond the actual contact layout and are embedded between two card layers.

FIG. 14 shows basically the same card structure as FIG. 13. The anchoring frame is already bent into the card interior during production of the card, i.e. during connection of the individual layers, resulting in the structure shown in FIG. 14. Production thus takes place analogously to the production already explained in conjunction with FIG. 12.

FIG. 15 shows a chip card in cross section, wherein the anchoring frame of the lead frame module is not bent and contact surfaces 73 of the electronic module are located below the card surface. The contact surfaces can be provided with relief punchings 75 in the transitional area to the extensions used for anchoring, so that they remain connected with the extensions only by thin bars. This leads to a mechanical decoupling of the transitional area between module and anchoring frame and thus to relief in this area upon bending loads on the card, so that adhesive layer 11 does not come off card layer 7 therebelow as quickly, e.g. due to tearing or splitting of this card layer.

FIG. 16 shows basically the same cross section as FIG. 15. However, adhesive layer 11 extending below the anchoring frame goes as far as the edge area of the bottom part of the two-step gap, thereby obtaining a greater adhesive surface for gluing the electronic module. FIG. 16 also shows heated die 77 which can be used to further improve the compound between the anchoring frame and adhesive layers 11 in a separate unit.

FIG.17 finally shows a production method for a paper IC card consisting of two layers connected by means of a contact adhesive. In a first method step (FIG. 17a) compound elements 33 are produced from contact adhesive band 31 coated with silicone band 29. This is done by methods known from labeling technology which are familiar to the expert and need not be explained more closely here. Additionally the production of such compound elements is known from DE-OS 41 22 049. Silicone band 29 provided with compound elements 33 is brought together with paper layer 35 provided with contact adhesive layer 37. Since the adhesion of the compound element is greater to the contact adhesive layer than to the silicone layer, the compound element can be transferred to contact adhesive band 37, yielding the intermediate product shown in FIG. 17b. In a further method step (FIG. 17c) electronic modules 1 are punched out of module band 39 and glued to compound element 33. The intermediate product shown in FIG. 17c is brought together with prepunched cardboard band 17 with windows 15 in such a way that the modules glued on paper layer 35 come to lie in the windows. Finally, finished paper IC cards 3 are punched out of the endless band, as shown in FIG. 17e. It is of course also possible to manufacture the paper card individually. In this case the individual card layers shown in the figures are already card-sized, so that one already obtains the card body in the desired dimensions after connection of the individual layers.

The above statements always relate to embodiments in which finished paper or cardboard webs are provided or brought together and an electronic module inserted in the card body at the same time or subsequently. Alternatively it is also possible already to incorporate electronic modules in the cardboard during production of the latter. This method can be applied especially advantageously with electronic modules for noncontacting data exchange, e.g. consisting of a ring-shaped coil and an integrated circuit electrically connected with the coil, since these modules have lower requirements for positional accuracy in the finished data carrier than modules for contacting data exchange. Further, the electronic modules for noncontacting data exchange are surrounded on all sides by cardboard and embedded positively therein, without elaborate measures having to be taken for producing a channel for the module coil. The electronic modules are preferably embedded in the cardboard in matrix form so that one finally obtains a multiple-copy sheet or multiple-copy web out of which individual data carriers with modules are punched. The sheet can already be provided during production with position markings to permit the punching tool to be positioned exactly so that, after punching, the electronic module is positioned properly relative to the outside edges of the data carrier. It is further possible to provide the sheet with a printed image before punching, so that the data carrier is already finished after punching. Alternatively it is possible to provide the multiple-copy sheet bearing electronic modules for noncontacting data exchange with printed cover layers on both sides and then to punch out the individual data carriers. In this case the position markings for the punching tool can be provided in the printed image of a cover layer so that position markings in the cardboard can be dispensed with.

One can take various measures which are explained in connection with FIGS. 18 to 21 to prevent splitting of the paper or cardboard in the edge area of the punched-out paper IC cards.

FIG. 18 shows in a plan view a detail of an endless band having a multilayer structure, for example that shown in FIG. 5 in cross section. The core layer or layers of the multilayer card structure contain through holes 79 in the area where punching edge 81 of the card to be punched out is located.

FIG. 19 shows a cross section along line A—A of FIG. 18. During connection of the individual card layers material from adjacent thermally activable adhesive layers 11 penetrates into the through holes so that cover layers 5 and 9 are indirectly interconnected. If one now punches the card out along punching edge 81 in such a way that at least a part of each through hole 79 is located in the card body, as indicated in FIGS. 18 and 19, one obtains a card edge which consists in the core area alternately of paper or cardboard and adhesive material from the adhesive layers. This largely prevents splitting of the core layer.

FIG. 20 shows an already punched-out paper IC card in a plan view. To protect the edge of the card from splitting, special protecting lacquer 85 is applied thereto with spreading unit 83. The cards can be processed either individually or several in a stack simultaneously.

FIG. 21 shows a stack of card bodies 3 in cross section to the edges of which protecting lacquer 85 is transferred from transfer band 87 with the help of heated die 89 by the transfer method.

The edges of the paper cards are preferably provided with protecting lacquer if the cards have a single-layer card structure, since in this case the method explained in conjunction with FIGS. 18 and 19 is unfeasible. Multilayer cards can of course also be provided with protecting lacquer, whereby this lacquer can be the only, or an additional, protective measure against splitting of the card edge. The protecting lacquer can be colored and used as additional identification or an additional security feature.

Finally it should be mentioned that the layers forming the cover layers of the card can already be provided with printed images, etc., completely or in certain areas before production of the IC cards, whereby all common printing processes can be used such as relief embossing, offset printing, steel gravure printing, screen printing, letterpress printing, blind blocking, dough printing, wallpaper printing, hectographic printing, etc. By using art paper one can further increase the high printing quality already achievable on paper. One can also include certain information (e.g. the credit balance of a new telephone card, etc.) in the printed image in embossed printing, e.g. by embossing or by especially thick inking. In the finished card the external surfaces of the cover layers can be protected by a thin layer of lacquer consisting e.g. of nitrocellulose lacquer, calender lacquer, UV-curing lacquer, electron-beam curing lacquer, etc. The lacquer can be applied in the form of gloss lacquer or matte lacquer. It is also possible to grain the layers of lacquer.

Individual layers can additionally be provided with security elements, such as watermarks, scents, security threads, fluorescent fibers in paper or cardboard, color capsules in paper fibers, holograms, etc.

It is also especially easy to apply other elements to paper cards, such as a magnetic track by applying a waterbase magnetic lacquer or a match rubbing surface.

Finally, threads can be worked into the thicker paper layers or cardboard layers during production of these layers to make these layers less likely to split. Suitable techniques are known from paper processing and will not be explained more closely here. For connecting the individual paper or cardboard layers one can use not only thermally activable adhesives but also contact adhesives or liquid adhesives. To prevent splitting of the paper or cardboard in the area of the gap for the module one can strengthen these areas by cloth, liquid adhesives or resins.

We claim:

1. A data carrier formed as an IC card consisting of at least one of paper and cardboard, said data carrier comprising a card body made of at least one of paper and cardboard, and an electronic module for exchanging data with an external device, dimensions of said card body fulfilling ISO standard ISO 7810, said electronic module having contact surfaces for touch contact, and said electronic module being embedded in said card body at such a position that said contact surfaces are located in an area of said data carrier fixed by ISO standard ISO 7816/2.

2. The data carrier of claim 1, wherein said card body comprises a gap for receiving said electronic module and said electronic module is glued into said gap in said card body in a manner offering good protection against splitting of said card body.

3. The data carrier of claim 1, wherein said card body comprises a gap for receiving said electronic module and said electronic module is glued into said gap in said card body with a liquid adhesive.

4. The data carrier of claim 3, wherein said liquid adhesive moistens at least largely an entire wall area of said gap so as to prevent splitting of said card body in said wall area.

5. The data carrier of claim 3, wherein said gap is provided with at least one undercut filled with said liquid adhesive.

6. The data carrier of claim 1, wherein said card body is formed from single-layer cardboard containing a gap for receiving said electronic module.

7. The data carrier of claim 1, wherein said card body has a plurality of layers and at least one of the outermost layers and at least one of the inner layers are provided with a window to form a two-step gap in which said electronic module is embedded.

8. The data carrier of claim 7, wherein said layers are interconnected by adhesive layers formed as one of thermally activable layers and contact adhesive layers.

9. The data carrier of claim 8, wherein one of said adhesive layers connecting said at least one of said outermost layers with said inner layers is exposed in a shoulder area of said two-step gap and serves to connect said electronic module with said card body.

10. The data carrier of claim 1 wherein surfaces of said card body are provided with a surface coating and with a printed image.

11. A data carrier formed as an IC card consisting of at least one of paper and cardboard, the data carrier having a card body made of at least one of paper and cardboard and an electronic module for exchanging data with an external device, dimensions of the card body fulfilling ISO standard ISO 7810, the electronic module being capable of noncontacting communication, and the electronic module being embedded in the card body in such a way that it is surrounded on all sides by paper or cardboard.

12. The data carrier of claim 11, wherein said card body has a plurality of layers, at least one of the layers located between the outermost layers of said card body being provided with a window for receiving said electronic module.

13. The data carrier of claim 12, wherein said layers are interconnected by adhesive layers formed as one of thermally activable layers and contact adhesive layers.

14. The data carrier of claim 12, wherein said electronic module has an anchoring frame located between two of said layers of said card body.

15. The data carrier of claim 14, wherein ones of said layers adjacent said anchoring frame are adhesive layers.

16. The data carrier of claim 11, wherein said card body is provided with a surface coating and a printed image.

17. A method for producing data carriers, comprising the steps of:
   (a) supplying cardboard with the thickness of said data carriers from a roll in endless form,
   (b) providing said cardboard with punchings at predetermined intervals so that windows arise in the cardboard,
   (c) providing said cardboard with debossing in the area of said windows so that depressions with a greater diameter than that of the windows arise in said cardboard in the area of said windows,
   (d) inserting electronic modules in the resulting gaps in the cardboard, whereby first areas of said electronic modules bearing contact surfaces for contacting coupling are located in said depressions and second areas of said modules bearing integrated circuits are located in said windows,
   (e) gluing said electronic modules in said gaps, and
   (f) punching individual data carriers out of said roll.

18. A method for producing data carriers, comprising the steps of:
   (a) supplying an upper cover layer, a lower cover layer and at least one core layer of at least one of cardboard and paper each from a roll,
   (b) punching windows in said core layer at predetermined intervals, bringing said core layer and said lower cover layer together and gluing them, whereby gaps arise in said core layer at the positions of said windows,
   (c) introducing an electronic module for noncontacting communication in said resulting gaps,
   (d) bringing said core layer together with said upper cover layer and gluing them together, and
   (e) punching individual data carriers out of the resulting band.

19. The method of claim 18, wherein the individual layers are interconnected by thermally activable adhesive layers which are activated by heated laminating rolls.

20. The method of claim 19, wherein:
   (a) at least a part of said core layers has through holes which are filled with adhesive from said thermally activable adhesive layers during connection of said card layers so that the layers adjacent said core layers are interconnected indirectly via said adhesive in said through holes,
   (b) said through holes are located in the area of the punching edges along which individual cards are punched out in a further step, and
   (c) said individual cards are punched out of the resulting sheet or band in such a way that said punching edges extend through said through holes in said core layers.

21. The method of claim 18, wherein the individual layers are interconnected by contact adhesive.

22. A method for producing data carriers, comprising the steps of:
   (a) supplying an upper cover layers, a lower cover layer and at least one core layer of at least one of cardboard and paper each from a roll,
   (b) providing said core layer and said upper cover layer with windows by punching, the openings in said cover layer being greater than the openings in said core layer,
   (c) interconnecting the three layers, yielding a band having two-step gaps at predetermined intervals,
   (d) introducing electronic modules in said two-step gaps, whereby parts of said electronic modules bearing contact surfaces for contacting communication are located in the upper areas of said gaps and parts of the electronic modules bearing integrated circuits are located in the lower areas of said gaps, and
   (e) punching individual data carriers out of the resulting band.

23. The method of claim 22, wherein said electronic modules are inserted in the card structure before connection of the individual layers, and are glued directly in said resulting gaps during connection of said layers.

24. The method of claim 22, wherein said electronic modules are glued into said gaps after connection of the individual layers.

25. A method for producing data carriers, comprising the steps of:
   (a) supplying an upper layer, a lower layer and at least one core layer of at least one of cardboard and paper,
   (b) interconnecting the layers, yielding a band or sheet,
   (c) cutting in at least said upper cover layer with a cutting tool at predetermined intervals in such a way that the edges of cut include certain areas,
   (d) using a milling tool to produce gaps in said areas, whereby the limits of said gaps located in said upper cover layer are fixed by said edges of cut,
   (e) introducing electronic modules in the resulting gaps, and
   (f) punching individual data carriers out of the resulting band or sheet.

26. A method for producing a data carrier, formed as an IC card and having an embedded electronic module, comprising the steps of:
   (a) producing cardboard and
   (b) embedding said electronic module in said cardboard during production of said cardboard in step (a).

27. The method of claim 26, wherein said cardboard being produced has a thickness of said IC card.

28. The method of claim 26, further comprising providing said cardboard with at least one cover layer.

29. The method of claim 26, wherein said cardboard is produced as one of a multiple-copy sheet and a multiple-copy web in which a plurality of said electronic modules are incorporated in a matrix arrangement, and individual data carriers are punched out of said multiple-copy sheet or web in such a way that each of said data carriers contains at least one of said electronic modules.

30. The method of claim 26, wherein electronic modules for noncontacting data exchange are embedded in said cardboard, so as to be surrounded by said cardboard positively and on all sides.

* * * * *